United States Patent [19]

Winchell, II et al.

[11] 4,394,678

[45] Jul. 19, 1983

[54] ELEVATED EDGE-PROTECTED BONDING PEDESTALS FOR SEMICONDUCTOR DEVICES

[75] Inventors: Vern H. Winchell, II, Phoenix; Thomas A. Scharr, Tempe; Lowell E. Clark, Phoenix, all of Ariz.

[73] Assignee: Motorola, Inc., Schaumburg, Ill.

[21] Appl. No.: 76,879

[22] Filed: Sep. 19, 1979

[51] Int. Cl.³ ............... H01L 23/48; H01L 29/44; H01L 29/52

[52] U.S. Cl. ................................. 357/68; 357/65; 357/71

[58] Field of Search ...................... 357/68, 71, 65

[56] References Cited

U.S. PATENT DOCUMENTS

| | | | |
|---|---|---|---|
| 3,345,210 | 10/1967 | Wilson | 357/71 |
| 3,496,428 | 2/1970 | de Volder | 357/68 |
| 3,585,461 | 6/1971 | Eynon | 357/71 |
| 3,617,818 | 11/1971 | Fuller | 357/68 |
| 3,629,669 | 12/1971 | Kauppila | 357/68 |
| 3,759,798 | 9/1973 | Graff et al. | 357/71 |
| 3,761,309 | 9/1973 | Schmitter et al. | 357/68 |
| 3,840,398 | 10/1974 | Sonntag | 357/71 |
| 3,918,032 | 11/1975 | Nicolaides | 357/71 |
| 3,935,635 | 2/1976 | Botzenhardt | 357/71 |
| 3,942,187 | 3/1976 | Gelsing et al. | 357/71 |
| 4,005,455 | 1/1977 | Watrous et al. | 357/71 |
| 4,151,545 | 4/1979 | Schnepf et al. | 357/71 |
| 4,164,461 | 8/1979 | Schilling | 357/71 |
| 4,267,012 | 5/1981 | Pierce et al. | 357/71 |

*Primary Examiner*—Andrew J. James
*Attorney, Agent, or Firm*—Robert M. Handy

[57] ABSTRACT

An elevated bonding pad suitable for wire or lead frame attachment and having an insulating layer completely over its outer periphery. The structure simplifies the processing required to form an elevated bonding pad, and serves to protect the periphery against bonding damage, and provides protection against corrosion of the bonded encapsulated semiconductor unit.

9 Claims, 4 Drawing Figures

ELEVATED EDGE-PROTECTED BONDING PEDESTALS FOR SEMICONDUCTOR DEVICES

RELATED APPLICATIONS

Scharr and Winchell, entitled "Semiconductor Chip with Direct-Bonded External Leadframe," Ser. No. 6/076,878, filed on even date herewith and assigned to the assignee of the present invention.

BACKGROUND AND SUMMARY OF THE INVENTION

This invention relates to contact means for semiconductor devices and, in particular, to edge protected bonding pedestals for attachment to a hard metal leadframe.

Multileaded semiconductor devices such as monolithic integrated circuits have traditionally been provided with external connections by wire bonding between the small bonding pads integral with the intra-device metallization and external metallic conductors which are mechanically supported by the package. To decrease costs and increase reliability, various structures for gang-bonding to external metallic connections have been utilized or proposed. For example, solder pedestals have been provided over the bonding pad locations by evaporating solder through a mask. The individual circuits are then soldered to an external metallization pattern such as a printed circuit. It is also known to selectively plate the bonding pads in order to provide pedestals suitable for gang-bonding of a soft metallic leadframe which is subsequently bonded to a hard external leadframe.

In any of these processes, it is common to provide an insulating layer over the intra-circuit metallization in order to protect (passivate) the internal connections during assembly of the semiconductor element. If the bonding pads are formed solely by the metallization used for the intra-circuit connections, the passivating layer is typically formed over the metallization and bonding pad structures and then etched to provide access to the bonding pads.

If bumps are to be found, additional film or films are deposited in the apertures, the height of the bump structure being increased by subsequent plating operations. Known metallurgy of such bump structures comprise an alternating sequence of at least two different metals in which the potential for electrochemical corrosion is inherent. In the more conventional bumpless structure, the fact that the passivating layer is the highest point at the bonding pad site makes it highly vulnerable to damage during the bonding operation, because the space allocated to the bonding pad may be sufficiently small that the possibility of application of the high bonding pressure to the passivating layer is significant. If the passivating insulating layer is cracked or damaged as a result of this operation, crevice regions at the edge of the metallization are exposed to the package ambient, which often contains corrosion-inducing materials. The possibility of metallization corrosion failure is highest at the crevice exposures of the metal edges because of the higher electrochemical potential electric fields thereat. Thus either monometal or bimetal systems are prone to corrosion when their lateral edges are not sealed.

In view of the foregoing, it is an object of this invention to provide a semiconductor bonding pedestal having a raised portion to allow lead bonding without damage to the insulator which seals the semiconductor device metallization pattern except at the broad faces of the bonding pad.

It is a further object of this invention to provide such a raised edge, passivated pedestal without adding significantly to the complexity of the processes utilizing the fabrication of the semiconductor element.

It is yet a further object of this invention to provide elevated edge-passivated pedestals which are pedestals which are suitable for direct gang-bonding of a planar self-supported metallic leadframe substantially harder than both known copper, nickel or aluminum leadframe materials and the metallization used for the intra-device interconnections.

The improved bonding pedestal of the present disclosure comprises a non-planar metal bonding layer. The non-planar metal bonding layer is lowest at the periphery of the bonding pad and is provided with a support element approximately central to the bonding pad. This support element may be formed of the same metal as the bonding pad, may be an insulator formed as a result of the semiconductor structure fabrication, may be a metal layer of different composition than the bonding pad, or some combination of the foregoing. The central support structure has a height somewhat greater than that of the passivation used to cover the intra-device metallization. This passivation then covers only the peripheral lower portion of the metal bonding layer which then becomes the highest point in the bonding pedestal structure where it overlies the support element. In such a structure the lateral edges of the metallic bonding pad are completely covered and sealed by a passivating layer which is not subject to damage by the bonding process. The metal bonding layer, in turn, passivates the metal layers of the support element.

DETAILED DESCRIPTION OF THE PREFERRED EMBODIMENTS

Figure 1:
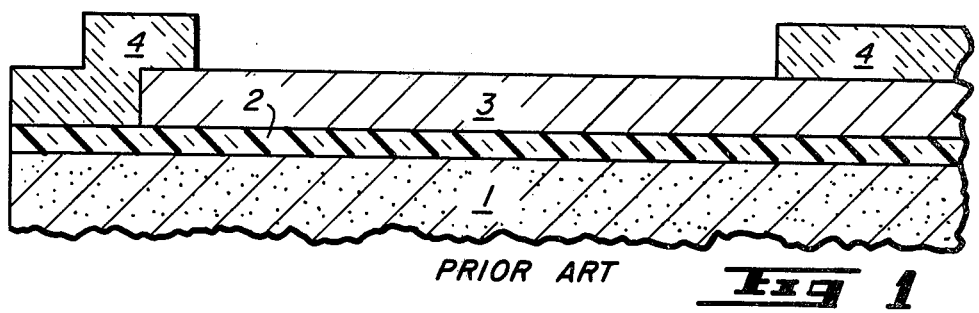
FIG. 1 is a cross-section of a known bonding pedestal.

FIG. 1 is a cross-section of the edge of a semiconductor die or chip having a known bonding pad configuration. In this figure, element 1 is a semiconductor substrate, typically of silicon, which contains PN junction comprising devices, not shown. The entire substrate is typically overlain by insulating layer 2 which typically comprises silicon dioxide or silicon nitride. Near the periphery of the die or integrated circuit chip is bonding pad 3 typically formed from a layer of aluminum. Aluminum alloys or other metals can be used although aluminum is conventional. The aluminum layer extends to the right in FIG. 1 in order to make connection with the devices formed in the silicon substrate 1 through vias or apertures, not shown, in insulator 2.

It is common practice to have the metal layer forming bonding pad 3 also comprise the intra-circuit metallization that connects the internal devices on the chip. In order to protect (passivate) this intra-circuit metallization, which typically is composed of intricate patterns, insulating layer 4 is often deposited. Insulating layer 4 typically comprises a doped silicon dioxide or silicon nitride that has a thickness on the order of 5,000–10,000 Angstroms. Layer 4 is formed over the metallization on the entire device and apertures are then cut through layer 4 to metal layer 3 to expose the bonding pads, and only one of which is shown here. On the left-hand side of FIG. 1 passivating layer 4 extends up and over the periphery of the bonding pad. The purpose of this configuration is to protect the periphery of the aluminum metallization in order to preclude corrosion which will be enhanced at the point of highest electric field, which occurs at the edge of the metal layer. Also, metal layer 3 is an etch stop for the etchant used to cut the aperture through insulating layer 4. This prevents attack of the underlying insulator 2 and possible short-circuits to the underlying substrate 1.

As can be seen from FIG. 1, insulator 4 is the most elevated point in the structure. Since the lateral dimensions of bonding pad 3 are ordinarily made as small as possible in order to minimize the substrate area occupied thereby, the area of bonding pad 3 is usually not much greater than that contemplated by the required connector attachment area. Thus if there is any misalignment at the time of connector attachment, such as misplacement of the connecting wire during a ball-bond operation, the point of applied bonding pressure will be in the upper level of insulating layer 4 rather than intended bonding pad 3. This not only reduces the bond strength but often cracks insulating layer 4, leading to premature corrosion failures at the periphery of the bonding pad.

In order to reduce the cost of the one pad at a time wire bond operation, it has become commonplace to make external electrical connection to a structure such as that shown in FIG. 1 by bonding multiple fine leads from a flat leadframe simultaneously to a number of spaced bonding pads identical with the one shown in FIG. 1. In this case insulating layer 4 tends to prevent the formation of a parallel bond of the flat lead frame to the flat surface area of bonding pad 3, particularly where the leadframe is relatively hard and unyielding. As an alternative to the structure shown in FIG. 1 for the lead frame application, it has been proposed to form an elevated bonding pad or pedestal by vacuum deposition and subsequent plating to form a multilayer system in the aperture in insulating layer 4 which exposes bonding pad 3. Such a structure is described in more detail for example in U.S. Pat. No. 4,087,314.

Figure 2:
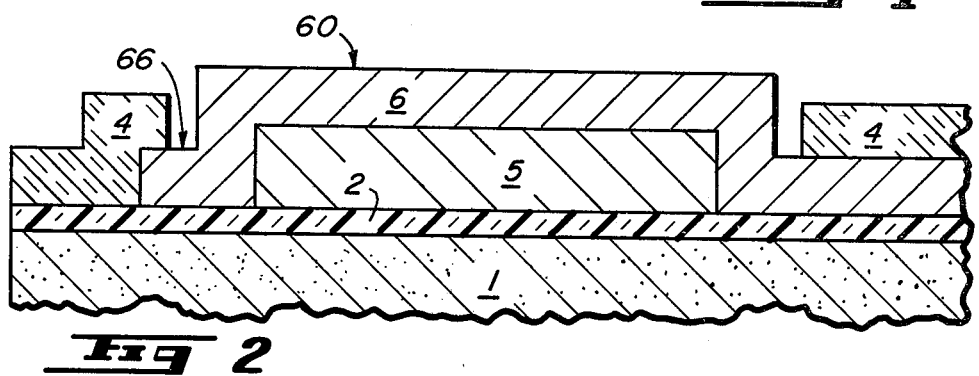
FIGS. 2, 3 and 4 are preferred embodiments according to the present invention.

The cited disadvantages of the structure of FIG. 1 are obviated by the embodiment of the instant disclosure shown in FIG. 2. In this embodiment, which is intended primarily for the wire bonding method of contact, layer 5 of a metal layer in the thickness range of 10–20,000 Angstroms is deposited and patterned in a size approximately that of the desired bonding pad. Following the formation of layer 5, layer 6 is deposited over layer 5 and runs off the figure to the right to make contact with the internal elements of the semiconductor device. Layer 6 also forms the intra-circuit metallization which is patterned simultaneously with the delineation of layer 6 in the bonding pad area in order to completely overlay bump 5 and extending laterally therefrom in all directions to form a two-level pedestal with a central elevated bonding pad portion 60. The passivating insulator is then deposited and etched so that it lies only over the lower level 66 of metal layer 6 at the bonding pad situs. If insulator 4 has a thickness less than that of bump metal layer 5, the upper level of layer 6 is the highest point on the structure and forms an elevated bonding pad that is completely edge-passivated. Layer 5 may be aluminum for metallurgical compatibility with the intra-circuit wiring layer 6 and simplicity of fabrication by known techniques.

Figure 3:
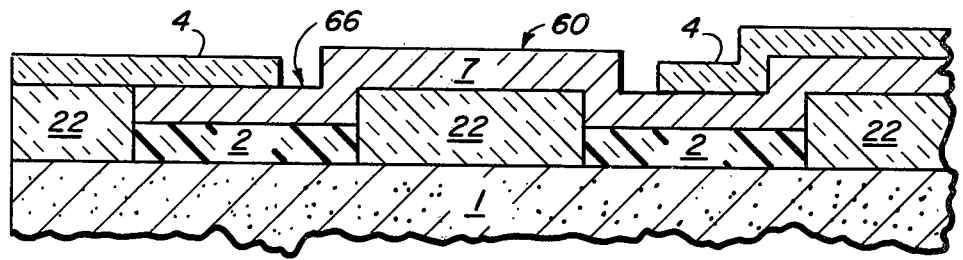

FIG. 3 shows an alternative embodiment of the improvement of FIG. 2 which eliminates the necessity of the extra deposition and patterning step of metal layer 5 which forms the elevated pedestal. In the embodiment of FIG. 3, underlying insulating member 2 and 22 comprise locally thicker portions 22 which are formed during the diffusion steps in the device fabrication sequence. That is, the semiconductor device structure is ordinarily formed by beginning with the thick insulating layer 22 which is then apertured for the diffusions which form the individual devices. During the diffusion processing, thinner insulating layers 2 may be formed as a result of reoxidation or insulator deposition. If the differential height between portions 22 and 2 is greater than the desired thickness of the passivating layer 4, then the elevated bond pedestal structure in FIG. 3 obtains without any additional processing. In this case the bonding pad consists of the layer of metallization 7 which is also used for the intra-circuit interconnects. The aperture in the passivating layer 4 is made larger in diameter than the diameter of the elevated portion of the underlying insulating portion 22 in order that the periphery of bonding pedestal is completely passivated at a level lower than the bonding situs. Inboard (input of FIG. 3) of the bonding pedestal, the insulating layer 4 may be the highest point of the structure if thick region 22 is used to reduce wiring capacitance as the bonded member extends only to the left of the pedestal.

While the two embodiments described hereinbefore are suitable for a semiconductor device connected by the wire bonding technique and having improved reliability, such structures are inapposite for the bonding of flat leadframe structure, particularly in the case where the leadframe is of a high tensile strength material such as Kovar or Alloy 42. Such hard lead frames bonded directly to the chip are desirable in that they obviate the necessity for a separate external leadframe which makes connection to a soft internal leadframe bonded to the die pads as in known configurations. The structure of FIG. 2 where both metals 5 and 6 are aluminum or aluminum alloys will not bond successfully directly to a hard lead frame because of the softness of the bonding pedestal layers. While the embodiment of FIG. 3 is somewhat harder overall, it too is not amenable to direct gang-bonding of a hard lead frame because the strength of thick insulator region 22 is insufficient to effect a strong metallurgical bond between layer 7 and the lead frame without cracking the insulating layer 22 or perhaps even the underlying substrate 1.

Figure 4:
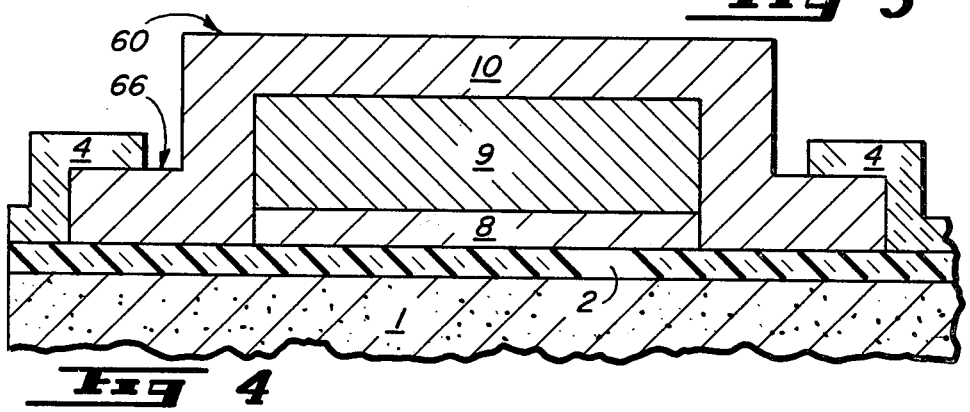

To overcome these problems, the structure of FIG. 4 is utilized. Here a patterned hard metal layer 8 comprising approximately 5,000 Angstroms of a film consisting of 10% titanium and 90% tungsten is combined with an approximately 20,000 Angstrom aluminum layer 9 to form elevated bonding pedestal 60. A thin layer of aluminum may be used beneath the titanium-tungsten layer in order to promote adhesion to the insulating layer 2. Metal layer 10 comprises the bonding pad itself and may also serve as the intra-circuit metallization (not shown). In any of these embodiments, insulating layer 2 need not be present where connection directly to the substrate (e.g. a diffused portion) is desired. Insulating layer 4 is patterned to completely cover the periphery of layer 10 in the bonding pedestal area at lower level portion 66 of pedestal 60. In this embodiment, the hard lead frame may be bonded directly to aluminum layer 10 without damage to the underlying insulator layer 2 or semiconductor substrate 1. Metal layer 8 is completely covered by layer 10 at its periphery, thus minimizing the potential for electrochemical attack. As with the structure shown in FIGS. 2 and 3, the bonding pad formed by layer 10 is completely protected at its edges by insulating layer 4 thus preventing corrosion at areas of high field. Also, all metal not covered by an insulating layer is monometallic in the sense that it comprises a metal layer of substantially uniform composition, thus reducing the possibility of corrosion.

There is thus provided by the present invention an improved bonding pedestal having overlapping conducting and insulating layers in a topography such that the conducting layer is locally higher than its surroundings. Since the conductive layer overlies the support element, acting as a passivation layer therefor, but underlies the insulator, the edges of the conductive layer are protected. Further, the processing required to obtain the support element is easily implemented with existing process techniques.

Having thus described the invention, it will be apparent to those of skill in the art that various modifications can be made within the spirit and scope of the present invention. For example, as previously noted, a variety of materials may be employed for the support element, depending upon the intended application.

What is claimed is:

1. A bonding pedestal for a semiconductor circuit containing intra-circuit metallization comprising:
   a semiconductor substrate;
   a bonding pad having an outer aluminum layer and lying over a portion of said substrate, said outer aluminum layer comprising a peripheral portion and a central portion, said central portion having a substantially planar aluminum bonding surface, and wherein said bonding surface is higher than said peripheral portion;
   a hard core under said central portion of said bonding pad, lying over said substrate and conformally covered on sides and top by said outer aluminum layer which forms said peripheral portion and said bonding surface; and
   insulating means covering said peripheral portion but lying at a lower level than said bonding surface in a region surrounding said bonding pad.

2. The bonding pedestal of claim 1 wherein said hard core comprises a metal of hardness exceeding aluminum.

3. The bonding pedestal of claim 1 wherein said core comprises a refractory oxide.

4. A bonding pedestal for a semiconductor substrate comprising:
   a patterned aluminum layer;
   an insulating passivation layer lying on portions of said aluminum layer and having an aperture coincident with at least a part of said patterned aluminum layer;
   an elevated bonding pad portion in said aluminum layer having a substantially planar aluminum bonding surface which protrudes through said aperture and lies above said passivation layer in a region around said aperture; and
   a localized support element within said elevated bonding pad portion, conformally coated on sides and top by said aluminum layer, said support element having a thickness greater than that of said passivation layer and an area less than that of said aperture.

5. The bonding pedestal of claim 4 wherein said localized support element is an insulator formed on said substrate.

6. The bonding pedestal of claim 4 wherein said localized support element is a metal.

7. The bonding pedestal of claim 6 wherein said metal consists essentially of aluminum.

8. The bonding pedestal of claim 2 or 6 wherein said metal comprises titanium and tungsten.

9. The bonding pedestal of claim 8 wherein said metal comprising titanium and tungsten further comprises an aluminum underlayer.

* * * * *